United States Patent [19]

Emery et al.

[11] Patent Number: 5,707,890

[45] Date of Patent: Jan. 13, 1998

[54] METHOD OF SHIFTING A WAVELENGTH IN A SEMICONDUCTOR STRUCTURE HAVING QUANTUM WELLS

[75] Inventors: Jean-Yves Emery, Paris; Léon Goldstein, Chaville, both of France

[73] Assignee: Alcatel N.V., Rijswijk, Netherlands

[21] Appl. No.: 409,581

[22] Filed: Mar. 24, 1995

[30] Foreign Application Priority Data

Apr. 6, 1994 [FR] France ................... 94 04017

[51] Int. Cl.$^6$ ................................. H01L 21/225
[52] U.S. Cl. .................. 437/110; 437/129; 437/160; 437/161
[58] Field of Search .................. 437/110, 160, 437/161, 129

[56] References Cited

U.S. PATENT DOCUMENTS

| | | | |
|---|---|---|---|
| 4,824,798 | 4/1989 | Burnham et al. | 437/110 |
| 4,830,983 | 5/1989 | Thornton | 437/161 |
| 4,847,217 | 7/1989 | Omura et al. | 437/160 |
| 5,023,199 | 6/1991 | Murakami et al. | 437/160 |
| 5,047,366 | 9/1991 | Murakami | 437/160 |
| 5,108,948 | 4/1992 | Murakami et al. | 437/110 |
| 5,255,370 | 10/1993 | Takahashi | 437/160 |
| 5,346,856 | 9/1994 | Jones et al. | 437/132 |
| 5,352,628 | 10/1994 | Funaba | 437/161 |

FOREIGN PATENT DOCUMENTS

| | | | |
|---|---|---|---|
| 0429979A3 | 6/1991 | European Pat. Off. | |
| 104160 | 9/1978 | Japan | 437/160 |

OTHER PUBLICATIONS

S.A. Bradshaw et al., "Very low loss waveguides formed by fluorine induced disordering of GaInAs/GaInAsP quantum wells," Fourth International Conference on Indium Phosphide and Related Materials, IEEE, pp. 604–607, 1992 (abs. only).

T.K. Tang et al., "Iso–electronic impurity–induced disordering: $Al_xGa_{1-x}As$–GaAs," Applied Physics Letters, vol. 59, No. 22, pp. 2880–2882, 25 Nov. 1991.

*Proceedings of the Sixth International Conference on Indium Phosphide & Related Materials*, Mar. 27–31, 1994, Santa Barbara, CA, Paper WC4, J–Y Emery et al "Intefrated Laser Waveguide Structures Using Selective Area Intermixing".

*Applied Physics Letters*, vol. 58, No. 13, 1 Apr. 1994, NY, US, pp. 1363–1365, S. O'Brien et al, "Monolithic Integration of an AlGaAs Laser and Intracavity Electroabsorption Modulator Using Selective partial Interdiffusion".

*Semiconductor Science and Tehcnology*, vol. 8, No. 6, Jun. 1993, London, GB, pp. 1156–1165, R. E. Mallard et al, "The control and evaluation of blue shift in GaInAs/GaInAsP multiple quantum well structures for integrated lasers and stark effect modulators".

*Applied Physics Letters*, vol. 55, No. 7, 14 Aug. 1989, NY, US, pp. 672–674, H. Ribot et al, "Disordering of GaAs/ AlGaAs multiple quantum well structures by thermal annealing for monlithic integration of laser and phase modulator".

*IEEE Photonics Technology Letters*, vol. 5, No. 11, 1261, NY, US pp. 1261–1263, "Low Threshold Lasers fabricated by the alignment free impurity induced disordering".

French Search Report FR 9404017.

Primary Examiner—Robert Kunemund
Attorney, Agent, or Firm—Sughrue, Mion, Zinn, Macpeak & Seas, PLLC

[57] ABSTRACT

From a top face of a semiconductor structure of the III-V type, inter-diffusion of elements between the wells and the barriers of an internal quantum structure is hot induced. The inter-diffusion is performed in one segment of the structure only, namely a segment in which the characteristic wavelength is to be shifted so as to constitute an amplitude modulator, another segment of the structure including a Bragg grating so as to constitute a laser emitter. In accordance with the invention, the inter-diffusion is induced by a layer of indium maintained in contact with the top face by means of a dielectric encapsulation layer. The invention is applicable in particular to optical telecommunications.

14 Claims, 2 Drawing Sheets

METHOD OF SHIFTING A WAVELENGTH IN A SEMICONDUCTOR STRUCTURE HAVING QUANTUM WELLS

FIELD OF THE INVENTION

The present invention generally relates to a method of shifting a wavelength in a semiconductor structure having quantum wells. It is applicable in particular to integrating a laser and an amplitude modulator in the form of two successive segments of the same semiconductor structure of the III-V type, the two segments constituting a laser segment and a modulator segment and differing from each other in that their waveguide layers have different characteristic wavelengths. An optical component resulting from such integration can be used in optical fiber telecommunications systems.

BACKGROUND OF THE INVENTION

Several methods are known for achieving such integration. A first such method is referred to as a butt-coupling method and is described in an article by: B. Garrett and E. J. Thrush—J. Crys. Growth—97 (1989) 273.

That method suffers from the drawback that it involves a large number of steps.

That drawback is avoided in a second known method described in an article by: T. Kats, T. Sanaki, K. Komatsu, and J. Mits, Electron—Letters; 28 (1992) 153.

The second method includes selective epitaxial growth in a zone delimited by a dielectric mask edging the laser segment. A difference then appears between the characteristic wavelengths of the two segments. This difference results from differences in thickness and in composition caused by gaseous species being diffused from the zones covered by the mask to zones that are open. At the present time, low-pressure organometallic vapor phase epitaxy (LP-OMVE) is the only technique that enables that method to be implemented. With that method, new techniques take a long time to develop.

A third known method may be referred to as "localized induced inter-diffusion". That method makes it possible to avoid the above drawbacks, and it is described in an article by: J. Y. Emery, L. Golstein, C. Stark, P. Pagnod-Rossiaux, J. L. Peyre, F. Gabarit, C. Labourie, F. H. Julien, and C. Francis. Proceedings of the Fifth International Conference on InP and Related Materials, Paris 1993, P1 (post-deadline paper).

The third known method is described below.

It suffers from the drawbacks of being difficult to use under industrial manufacturing conditions, and of giving results that are difficult to reproduce.

A particular object of the present invention is to make it simple to avoid the above drawbacks.

OBJECT AND SUMMARY OF THE INVENTION

To this end, the present invention provides a method of shifting a wavelength in a semiconductor structure having quantum wells. This method involves inter-diffusion of constituent elements of the wells and of the barriers of a quantum structure. This quantum structure is inside a III-V type semiconductor structure. The inter-diffusion is hot induced from the top face of the semiconductor structure. In the method, the inter-diffusion is induced by a layer of inducing material maintained in a condensed state in contact with said face of the semiconductor structure.

BRIEF DESCRIPTION OF THE DRAWINGS

An implementation of the present invention is described in more detail below by way of non-limiting example, and with reference to the accompanying drawings. When an element is shown in more than one figure, it is given the same reference. In the drawings.

MORE DETAILED DESCRIPTION

Figure 1:
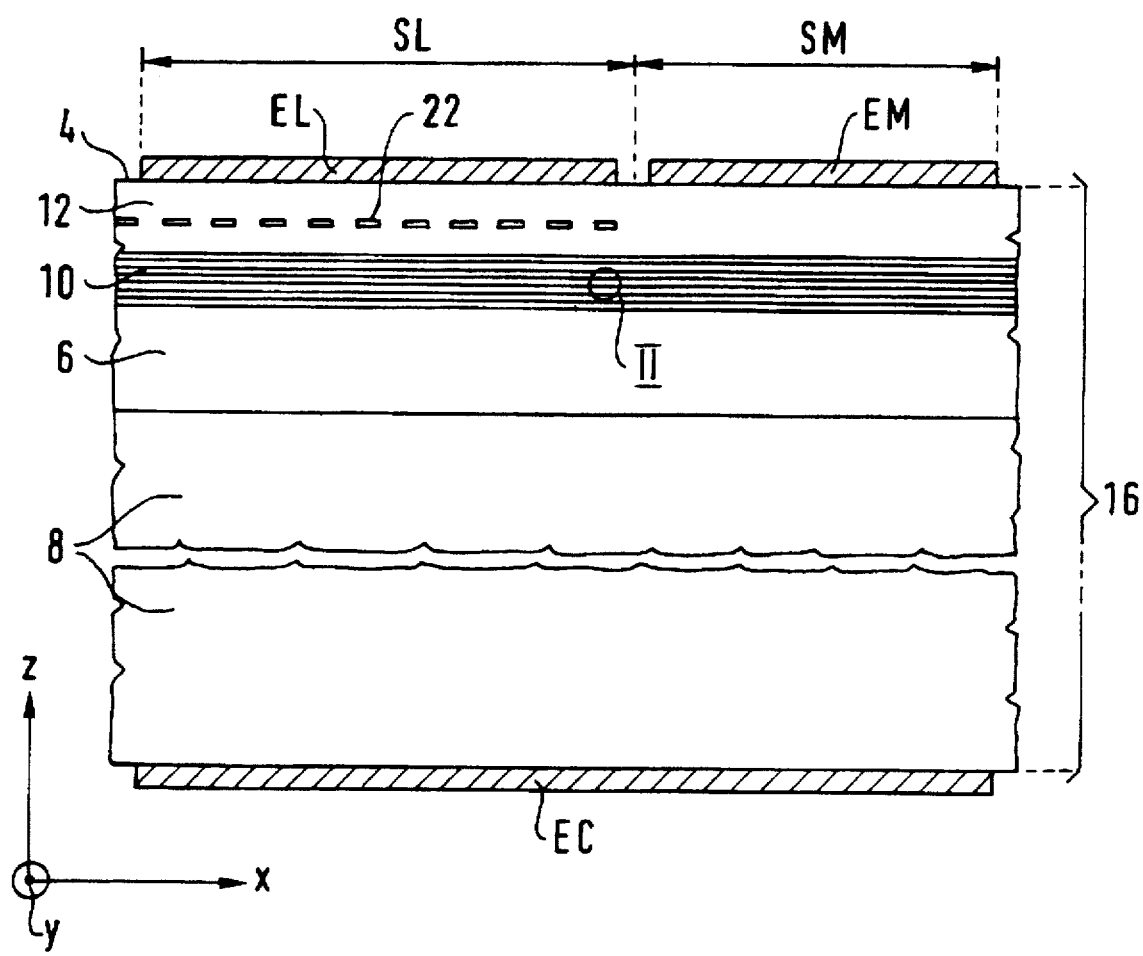
FIG. 1 is a longitudinal section view of a an optical component including a structure with wavelength shift, which structure is formed by means of the method of the invention.
Figure 2:
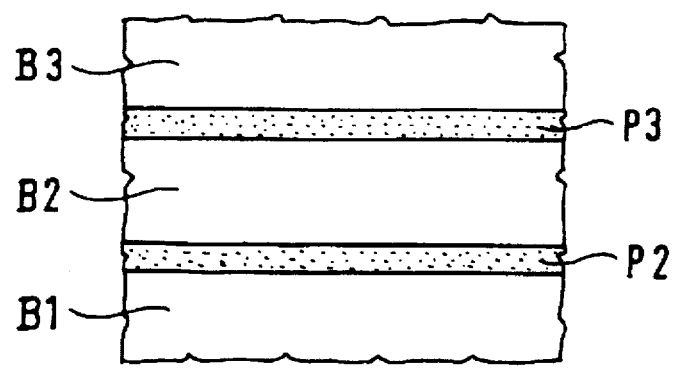
FIG. 2 shows a detail II of FIG. 1.
Figure 3:
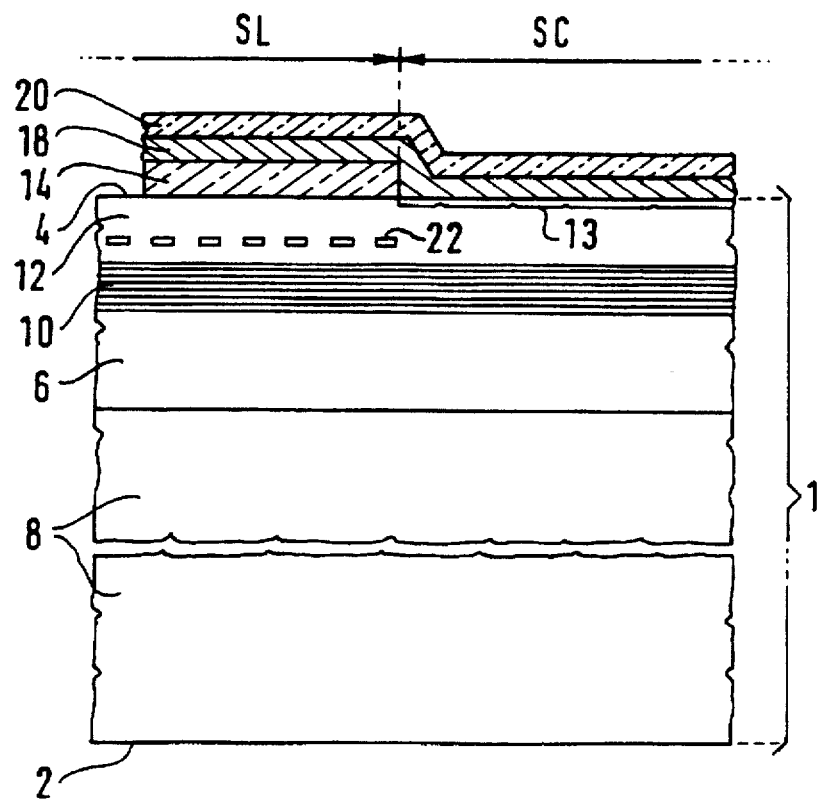
FIG. 3 is a fragmentary view of an initial structure during a wavelength-shifting step during which it is to be transformed into the structure with wavelength shift shown in FIG. 1; this fragmentary view is a longitudinal section view on line III—III of FIG. 4.
Figure 4:
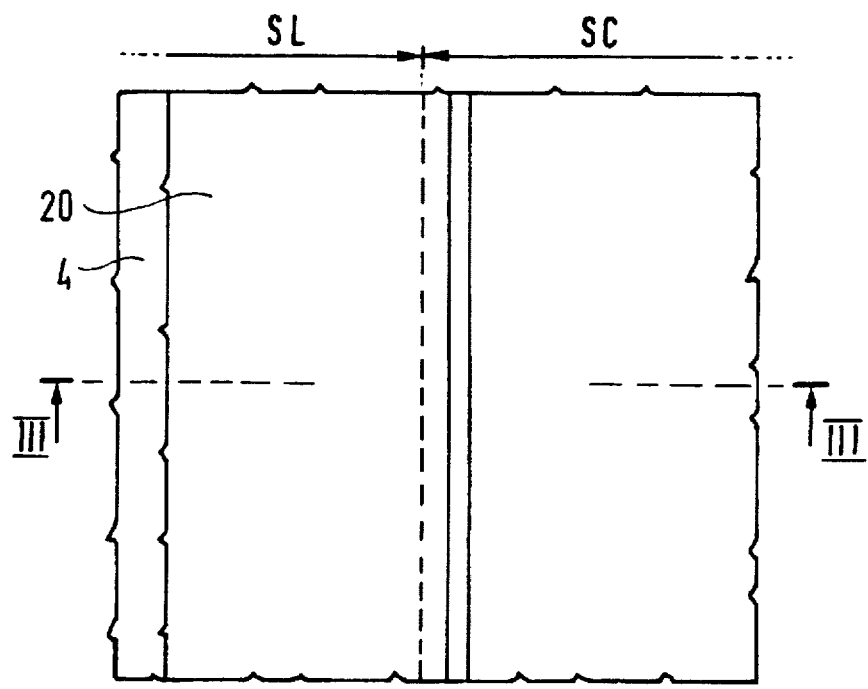
FIG. 4 is a fragmentary plan view of the FIG. 3 structure.

Firstly, various steps are described below which are common to the method of the invention and to the above-mentioned third known method.

In a first such common step, an initial mono-crystal structure is made of III-V type semiconductor materials including indium and gallium as III elements and phosphorus and arsenic as V elements. The ratio of the phosphorus content to the arsenic content of such a material is referred to below as the phosphorus-to-arsenic ratio of the material. The structure defines a longitudinal direction X, a transverse direction Y, and a vertical direction Z. It includes the following layers that succeed one another in the vertical direction going from a bottom face 2 to a top face 4 of the structure:

A bottom confinement layer 6. This layer is made of InP and is at least 200 nm thick. It has a first conductivity type, e.g. N-type. It is formed on a substrate 8 that has the same conductivity type and that is 300 μm thick.

A quantum structure 10. This structure is constituted by a vertical alternating succession of quantum wells such as P2 and P3 and of barriers B1, B2, and B3. For example, there may be six wells. Border surfaces SF appear between the wells and the barriers. The phosphorus-to-arsenic ratio of the material of the wells is different from the phosphorus-to-arsenic ratio of the material of the barriers. The quantum structure has a characteristic wavelength, e.g. 1.5 μm, that is dependent on said ratios, as well as on the thicknesses of the layers and on the III element contents. In the first step, the wavelength is constant in the longitudinal direction.

A top confinement layer 12 of a second conductivity type (P-type) that is opposite to the first conductivity type. This layer is made of InP and is at least 300 nm thick. The structure is such that a bias current being passed in a forward direction between the two confinement layers causes charge carriers of the two opposite types to be injected into the quantum structure 10. The injection enables light waves having said characteristic wavelength of the quantum structure to be selectively amplified.

The method then includes the following steps:

Two separate segments are defined along the length of the initial structure, which segments constitute a shifted-wavelength segment SM and a conserved-wavelength segment SL.

A protection layer 14 is formed covering the top face 4 of the initial structure in the conserved-wavelength segment SL while leaving that face exposed in the shifted-wavelength segment SM. For example the protection layer may be dielectric and it may be 300 µm thick.

In a shifting step, the top face is exposed under the action of a diffusion-inducing material at an inter-diffusion temperature. The concentration of the material and the temperature are sufficient to cause a modification affecting a surface portion 13 of the top confinement layer 12, and to induce inter-diffusion of the V elements in the quantum structure 10 via the top confinement layer. The inter-diffusion causes the phosphorus and the arsenic to diffuse via the border surfaces SF of the quantum structure 10, thereby causing a desired localized shift in the characteristic wavelength of the layer. The modification, the inter-diffusion, and the shift being at least limited by the protective layer 14 in the conserved-wavelength segment SL.

The resulting wavelength shift is a blue shift. It is a shift of a few tens of nanometers. For example, the conserved wavelength and the shifted wavelength may be 1,490 nm and 1,420 nm.

The top face 4 of the resulting modified initial structure is etched so as to remove the protective layer 14 in the conserved-wavelength segment SL, and the modified surface portion 13 of the top confinement layer 12 in the shifted-wavelength segment SM. In this way, a structure 16 is obtained which has a locally-shifted wavelength, which is capable of conducting said bias currents through said conserved-wavelength segment and through said shifted-wavelength segment, and which has different characteristic wavelengths in the two segments.

In the above-mentioned third known method, the shifting step involves putting the structure in a sealed bulb containing phosphorous as the inducing material. The bulb is then heated to an inter-diffusion temperature so as to expose the top face of the structure to a high vapor pressure of the material. The inter-diffusion temperature lies in the range 600° C. to 700° C.

In accordance with the present invention, the shifting step includes the following steps:

A layer of said inducing material 18 is deposited on the top face 4 of the initial structure 1. Advantageously, the inducing material is chosen from columns III and V of the periodic table of elements. Preferably, it is constituted by indium.

A leak-proof encapsulation layer 20 that withstands the inter-diffusion temperature is deposited on said layer of inducing material. For example, the encapsulation layer may be dielectric and it may be 50 nm thick.

The initial structure is heated to the inter-diffusion temperature which also lies in the range 600° C. to 700° C.

The encapsulation layer prevents the inducing material from evaporating, leaking out or oxidizing at that temperature. In this way, the drawbacks of having to put the structure in a sealed bulb are avoided. The structure protected by the encapsulation layer may be annealed several times so as to obtain accurately a wavelength shift of the desired value. It turns out that this shift varies linearly as a function of the total duration of the annealing operations performed at the inter-diffusion temperature. Furthermore, it is easy to deposit indium in the form of a thin layer having uniform thickness. Typically, this thickness lies in the range 3 nm to 300 nm, and it preferably lies in the approximate range 10 nm to 50 nm.

The above-mentioned range of inter-diffusion temperatures is low enough both to prevent III elements from being diffused via the border surfaces SF into the quantum structure 10, and also to prevent doping materials from being diffused from the bottom confinement layer 6 and from the top confinement layer 12 to the quantum structure.

The protective layer 14 and the encapsulation layer 20 are preferably made of commonly-used dielectric materials such as silica $SiO_2$ and silicon nitride $Si_3N_4$.

For the purposes of making components for an optical fiber telecommunications network, electrodes EL, EM, EC are deposited on the bottom face 2 and on the top face 4 of the structure 16 having the locally-shifted wavelength. On the top face 4, these electrodes are constituted by a laser electrode EL in segment SL, and by a modulator electrode EM in segment SM. On the bottom face 2, a common electrode EC is deposited.

A resonant cavity is formed in this structure, e.g. by means of a Bragg grating 22. The Bragg grating is situated in the top confinement layer 12 of the initial structure.

In this way, a semiconductor optical component is made including an emitter and a modulator in integrated form. The emitter is a laser emitter having positive gain in the conserved-wavelength segment. The modulator modulates the light from the emitter in the shifted-wavelength segment. Typically, the resonant cavity 22 is formed in the conserved-wavelength segment SL, and the modulator modulates the amplitude of the light from the emitter.

We claim:

1. A method of shifting a wavelength in a semiconductor structure having quantum wells, in which method elements are inter-diffused between at least one well and a barrier of a quantum structure, which structure is inside a III-V type semiconductor structure, the inter-diffusion being hot induced by an inducing material acting from a face of the semiconductor structure, wherein induced inter-diffusion operating conditions are selected to prevent doping materials contained in a confinement layer of said semiconductor structure from being diffused into the quantum structure, and wherein the inducing material is in the form of a layer of condensed substance maintained in contact with said face of the semiconductor structure.

2. A method according to claim 1, wherein said inducing material is chosen from III and V elements respectively included in columns III and V of the periodic table of elements.

3. A method according to claim 2, wherein said inducing material is indium.

4. A method according to claim 3, wherein said layer of inducing material has a thickness lying in the range 3 nm to 300 nm.

5. A method according to claim 1, wherein said inter-diffusion is performed at an inter-diffusion temperature that is high enough to enable V elements to be diffused, and that is low enough to prevent III elements from being diffused.

6. A method according to claim 5, wherein said inter-diffusion temperature lies in the range 600° C. to 700° C.

7. A method according to claim 1, in which method firstly an initial mono-crystal structure is made of III-V type semiconductor materials including indium and gallium as III elements and phosphorus and arsenic as V elements, the ratio of the phosphorus content to the arsenic content of such a material constituting a phosphorus-to-arsenic ratio of the material, the structure having a longitudinal direction, a transverse direction, and a vertical direction, and including layers that succeed one another in the vertical direction in the following order between a bottom face and a top face of the structure:

a bottom confinement layer of a first conductivity type;

a quantum structure constituted by a vertical alternating succession of quantum wells and of barriers having border surfaces between the wells and the barriers, the phosphorus-to-arsenic ratio of the material of the wells being different from the phosphorus-to-arsenic ratio of the material of the barriers, the quantum structure having a characteristic wavelength that is dependent on said ratios, the wavelength being initially constant in the longitudinal direction; and a top confinement layer of a second conductivity type that is opposite to the first conductivity type so that a bias current being passed in a forward direction between the two confinement layers causes charge carriers of the two opposite types to be injected into the quantum structure, and so that the injection enables light waves having said characteristic wavelength of the quantum structure to be selectively amplified, the method then including the following steps:

two separate segments are defined along the length of the initial structure, which segments constitute a shifted-wavelength segment and a conserved-wavelength segment;

a protection layer is formed covering the top face of the initial structure in the conserved-wavelength segment while leaving that face exposed in the shifted-wavelength segment;

in a shifting step, the top face is exposed under the action of a diffusion-inducing material at an inter-diffusion temperature, the concentration of the material and the temperature being sufficient to cause a modification affecting a surface portion of the top confinement layer, and to induce inter-diffusion of the V elements in the quantum structure via the top confinement layer, the inter-diffusion causing the phosphorus and the arsenic to diffuse via the border surfaces of the quantum structure, thereby causing a desired localized shift in the characteristic wavelength of the layer, the modification, the inter-diffusion, and the shift being at least limited by the protective layer in the conserved-wavelength segment; and the top face of the modified initial structure is etched so as to remove the protective layer in the conserved-wavelength segment, and the modified surface portion of the top confinement layer in the shifted-wavelength segment, whereby a structure is obtained which has a locally-shifted wavelength, which is capable of conducting said bias currents through said conserved-wavelength segment and through said shifted-wavelength segment, and which has different characteristic wavelengths in the two segments;

wherein said shifting step includes the following steps:

a layer of said inducing material is deposited on the top face of the initial structure;

a leak-proof encapsulation layer that withstands the inter-diffusion temperature is deposited on said layer of inducing material; and the initial structure is heated to the inter-diffusion temperature.

8. The method according to claim 7, wherein said protective layer and said encapsulation layer are made of dielectric materials.

9. A method according to claim 7, wherein electrodes are deposited on the bottom face and on the top face of the structure having the locally-shifted wavelength, a resonant cavity being formed in that structure so as to make a semiconductor optical component including an emitter and a modulator in integrated form, the emitter being a laser emitter having positive gain in the conserved-wavelength segment, the modulator modulating the light from the emitter in the shifted-wavelength segment.

10. A method according to claim 9, wherein said resonant cavity is formed in the conserved-wavelength segment, said modulator modulating the amplitude of the light from the emitter.

11. The method according to claim 3, wherein said layer of inducing material has a thickness lying in the range 10 nm to 50 nm.

12. The method according to claim 7, wherein said protective layer is made of one of silica $SiO_2$ and silicon nitride $Si_3N_4$.

13. The method according to claim 7, wherein said encapsulation layer is made of one of silica $SiO_2$ and silicon nitride $Si_3N_4$.

14. The method according to claim 1, wherein the induced inter-diffusion operating conditions include heating temperature and duration.

* * * * *